Sept. 15, 1970 W. A. FARRAND ET AL 3,529,213

EXTENDABLE PACKAGE FOR ELECTRONIC ASSEMBLIES

Filed April 8, 1969 2 Sheets-Sheet 1

INVENTORS
WILLIAM A. FARRAND
MALCOLM F. THOMPSON
BY
Robert G. Rogers
ATTORNEY

Sept. 15, 1970 W. A. FARRAND ET AL 3,529,213

EXTENDABLE PACKAGE FOR ELECTRONIC ASSEMBLIES

Filed April 8, 1969 2 Sheets-Sheet 2

INVENTORS
WILLIAM A. FARRAND
MALCOLM F. THOMPSON

BY Robert G. Rogers

ATTORNEY 3,529,213
Patented Sept. 15, 1970

3,529,213

EXTENDABLE PACKAGE FOR ELECTRONIC ASSEMBLIES

William A. Farrand, Fullerton, and Malcolm F. Thompson, Santa Ana, Calif., assignors to North American Rockwell Corporation Filed Apr. 8, 1969, Ser. No. 814,304
Int. Cl. H05k 7/02
U.S. Cl. 317—101 4 Claims

ABSTRACT OF THE DISCLOSURE

Modules comprising an electronic system are assembled within a housing which includes rails orthogonal to the output contact terminals about the peripheries of the module boards. The rails, insulated from each other, comprise a conducting layer. Frames each including a plurality of compressible electrical connectors corresponding to the rails are placed between each of the modules so that when the modules are assembled inside the housing, the connectors are compressed into contact with the conducting layer to form an electrical connection between the corresponding output contact terminals of each module. Frames are also positioned between the outermost modules and cover plates which are provided on their inner surfaces with peripheral contacts and wiring patterns connected to electrical connectors on the outside of the plates. The exterior connectors enable the assembled electronic system to be interconnected to other electronic systms.

BACKGROUND OF THE INVENTION

Field of the invention

The invention relates to a package for electronic assemblies and more particularly to a package in which electrical connection is made between modules through compressible electrical connectors.

Description of prior art

In order to satisfy the packaging requirements of existing electronic systems, improved packaging systems must be provided. Generally, modules of an electronic assembly are produced with the same circuits and with corresponding output leads or contacts. In order to interconnect the modules, according to present technology, a multilayer board is produced as the "mother board." As a result, it is necessary that the module positioning within the housing be maintained. In addition, present packaging systems are developed to satisfy the requirements of a particular electronic assembly. Therefore, as the system size and configuration changes, an additional package is required which would also require changes in the "mother board." As a result, packaging for electronic systems is relatively expensive.

What is needed is a relatively low cost package which eliminates the requirements for a mother board and, therefore, the requirement that the modules be placed in the same sequence inside the package. It is also desirable to produce a package which is usable by different systems and which can be expanded or reduced in size to accommodate changes in size of an electronic system. A preferred system would also include means for testing inside the system after it has been sealed.

The present invention satisfies the above requirements and provides an improved package, as described herein.

SUMMARY OF THE INVENTION

Briefly, the invention comprises a housing including conducting rails along its inside surfaces. Compressible or deformable, conductive rings (connectors) including circumferential portions disposed between module boards for electrically connecting corresponding output terminals of the module boards through the rails. In one embodiment, the contact terminals are formed along all the peripheral edges and on both sides of the module boards.

The modules are enclosed inside the housing so that the compressible connectors are pressed into contact with the conducting rails for providing the required electrical contact. The rails and compressible contacts replace a multilayer board or back panel wiring required for prior art packaging systems.

Since the modules are generally produced with the same output lead orientation, the sequence in which the modules are placed inside the housing is unimportant. Similarly, if the housing is required for packaging a different electronic system, all that is required is that the length, in use, of the housing be changed if the number of modules changes.

In one embodiment, the compressible connectors may be assembled to a frame and disposed between adjacent module boards. In another embodiment, the frame and compressible connectors may engage the periphery of the module boards. In a third embodiment, the invention may be used to electrically connect one electronic system to another.

Therefore, it is an object of this invention to provide an improved package for electronic systems using compressible electrical connectors for interconnecting the modules of the system.

It is still another object of this invention to provide a package in which conducting layers are deposited as rails along the housing surfaces for electrically connecting corresponding output terminals of modules of an electronic system through compressible electrical connectors.

A still further object of the invention is to provide a package for electronic assemblies which eliminates the necessity for a multilayer interconnection board.

It is another object of this invention to provide a package for an electronic assembly in which the sequence of the assembled module boards in the package is not important.

A further object of the invention is to provide a package in which the housing portion can be expanded or reduced to accommodate various electronic assemblies without the necessity for designing a new package for each assembly.

A further object of the invention is to provide a process for packaging electronic assemblies which uses compressible electrical connectors secured to frames interposed between each of the modules of the electronic assembly being packaged so that when compressed the connectors contact conducting rails to interconnect corresponding output terminals of all modules of the assembly.

Another object of the invention is to provide a package in which leads may be formed on all edges of the module boards and not on just one edge.

A still further object of the invention is to provide a housing for an electronic system that can be easily adapted for connecting the system to another system.

DESCRIPTION OF THE PREFERRED EMBODIMENT

Figure 1:
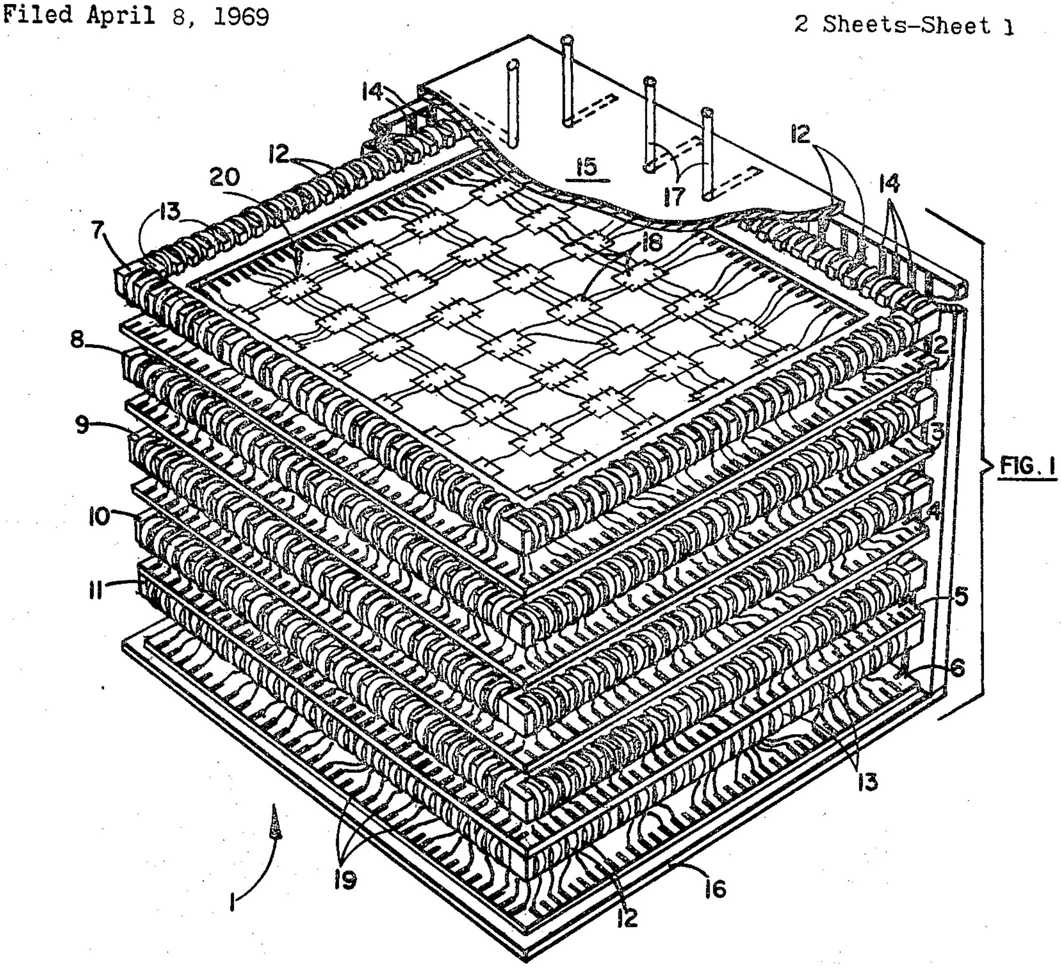
FIG. 1 illustrates a cutaway perspective view of one embodiment of the system in which the connectors are on frames between the module boards.

FIG. 1 shows one embodiment of package 1 and a plurality of modules 2 through 6 separated by frame members 7 through 11. Each of the frame members comprise a plurality of compressible electrical connectors represented generally by the numeral 12. The modules and frame members are enclosed within housing 13 (partially illustrated) which may be produced in a configuration and length as a function of a particular electronic assembly being packaged. If the number of modules comprising an electronic assembly increases, the length of the housing can be increased. On the other hand, if the number of modules decreases, the length of the housing can very easily be reduced or dummy cards and frames used to take up the requisite space.

The interior surfaces of the housing includes rails represented generally by the numeral 14. The rails are perpendicular to the modules of the electronic assembly and are a conducting metal, preferably a good contact metal such as gold. The rails are insulated from each other.

The modules are comprised of an insulative substrate such as beryllia on which conductive circuit patterns, shown generally by numeral 20, have been formed on both sides. The circuit patterns terminate at output contact pads, designated generally by numeral 19, about the peripheries of the substrate. The contact pads may be .010 inch wide on 0.025 inch centers which correspond to the spacing of the rails of the housing. Electronic elements such as integrated circuits 18 may be connected by soldering or welding to the substrate in order to produce an electronic module. In certain embodiments, two circuit patterns may be required to interconnect all the leads of the integrated circuits. In that case, the first pattern, produced for example by etching, is covered by an insulating layer. The second pattern is produced over the insulating layer. Processes for producing circuit patterns on substrates are well known to persons skilled in the art and for that reason additional details are not included.

Top and bottom covers 15 nad 16, respectively, enclose the ends of the housing to complete the package. For the particular embodiment shown, top cover 15 includes a printed wiring pattern (not shown) on its inner surface with contact pads about its periphery spaced in accordance with the spacing of the rails of the housing. Connector pins 17 protruding from the other surface of the cover plate are connected through the cover 15 to the circuit wiring pattern (partially sown) on the inside surface of the cover. The pins are used to permit other electronic systems such as power supplies, input/output equipment, display devices, etc. to be connected to the assembled system. It is pointed out that in other embodiments the bottom cover 16 may also be provided with a printed wiring pattern and connecting pins.

The frame member 7 including compressible connectors 12 in interposed between the outermost module 2 and the cover plate 15 to complete the electrical connection between the modules and the connecting pins.

The compressible connectors are flexible and compressible metal rings which have been secured to the inner surfaces of the insulating frames. The rings, disposed about the longitudinal axis of the sides of the frames may be secured between the ridges 21 of the frames by an interference fits or by a suitable adhesive. The frames are produced, such as by molding, or by cutting, so that the ridges 21 are formed so that a slot or space is provided with each of the connectors. The ridges insulate the rings from each other and, in addition, prevent the rings from being overcompressed between the modules. The ridges also support the modules inside the housing.

Prior to being compressed together as when the cover plates are applied to enclose the modules and frame member inside the housing, the compressible connector rings are relatively circular. The diameter of the uncompressed connectors is small enough to permit the frame members to be easily inserted inside the housing. The connectors are spaced to correspond to the slots and the output contact pads about the peripheries of the module board. When pressed together, the generally circular configuration of the rings change so that the outer edges of the connectors are pushed into contact with the conducting layers inside the slots. Simultaneously, the contact pads about the peripheries of the module boards are pressed against the top and bottom surfaces of the connectors so that the corresponding contact pads of all the module boards are interconnected through the appropriate connectors and conducting rails.

The connectors of the outermost frame member are similarly pressed into contact with the conducting slots to interconnect the rails to the cover plate.

As a result of using compressible connectors and the conducting rails, the necessity for a multilayer interconnecting board is eliminated. In addition, since the modules are produced with contact pads about their peripheries, it is less expensive to produce the modules and more contacts are available. Packaging costs are reduced by using a housing which can be produced with differences only in length to accommodate a plurality of electronic assemblies. In addition, since the modules have the same contact pad orientation, the sequence of the modules inside the assembly is not important.

It is pointed out that although a generally circular configuration is shown in FIG. 1, other compressible connector configurations are also possible. In addition, the connectors may be comprised of individual members which can be deformed into contact with the conducting rails.

Figure 2A:
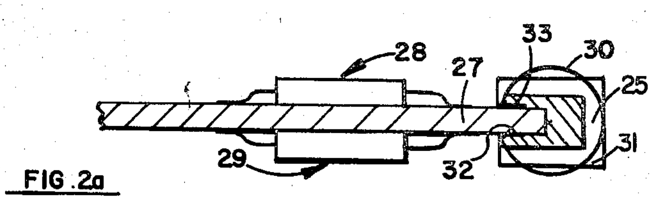
FIG. 2*a* is a schematic illustration of a different embodiment of a frame member showing the ring connectors in an uncompressed state.

FIG. 2*a* shows a different embodiment of frame member 25 which includes a longitudinally extending slot 26. The slot mates with the peripheral edge of module 27. The module is shown as having circuit components 28 and 29 disposed on both sides of the module. Other elements such as circuits, contact pads, etc. are omitted from the figure for convenience.

Conducting ring 30 is shown in its uncompressed state. Its outer circumferential surface extends above the ridge 31 of the frame member. Ends 32 and 33 of the ring member are folded inside slot 26 to make electrical contact with the contact pads of the module.

The FIG. 2*a* embodiment is different from the FIG. 1 embodiment in that the frame members engage the outer edges of the modules in FIG. 2*a* whereas in FIG. 1, the frame members are disposed between the modules. In the FIG. 2*a* embodiment, the circumferential surface of adjacent rings contact to provide electrical connections between the circuits of the modules. In FIG. 1, the circumferential surface of the conducting rings contact adjacent contact pads about the peripheries of the modules.

Figure 2B:
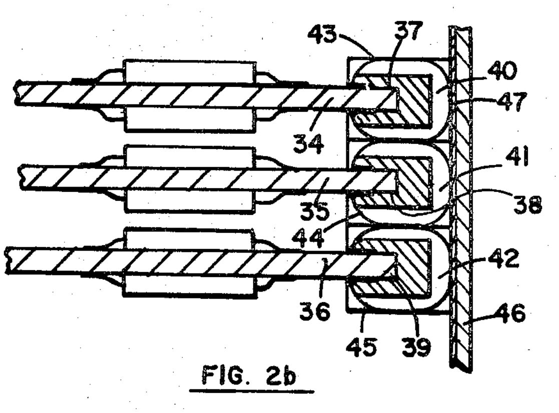
FIG. 2*b* illustrates a different embodiment of the system in which the compressible connectors are on frames which engage the edges of the module boards.

FIG. 2*b* shows a plurality of modules 34, 35 and 36 engaged about their edges within slots 37, 38 and 39 of frame members 40, 41 and 42, partially shown. The compressible rings of each frame member represented generally by numerals 43, 44 and 45 are squeezed together inside housing 46 to provide electrical connections between each of the modules. The outer circumferential surface of the rings contact conducting rails, designated generally by numeral 47, on the inner surfaces of the housing so that input and output connections can be made to the modules.

An additional feature of the frame members is also more clearly shown in FIG. 2*b*. The ridges of the frame members have a height which not only prevents over compression of the rings but which also prevent the circuits of adjacent modules from coming into contact. It is also pointed out that in the FIG. 2*b* embodiments, the conducting rails are not essential since electrical contact can be made between adjacent connectors.

Figure 3:
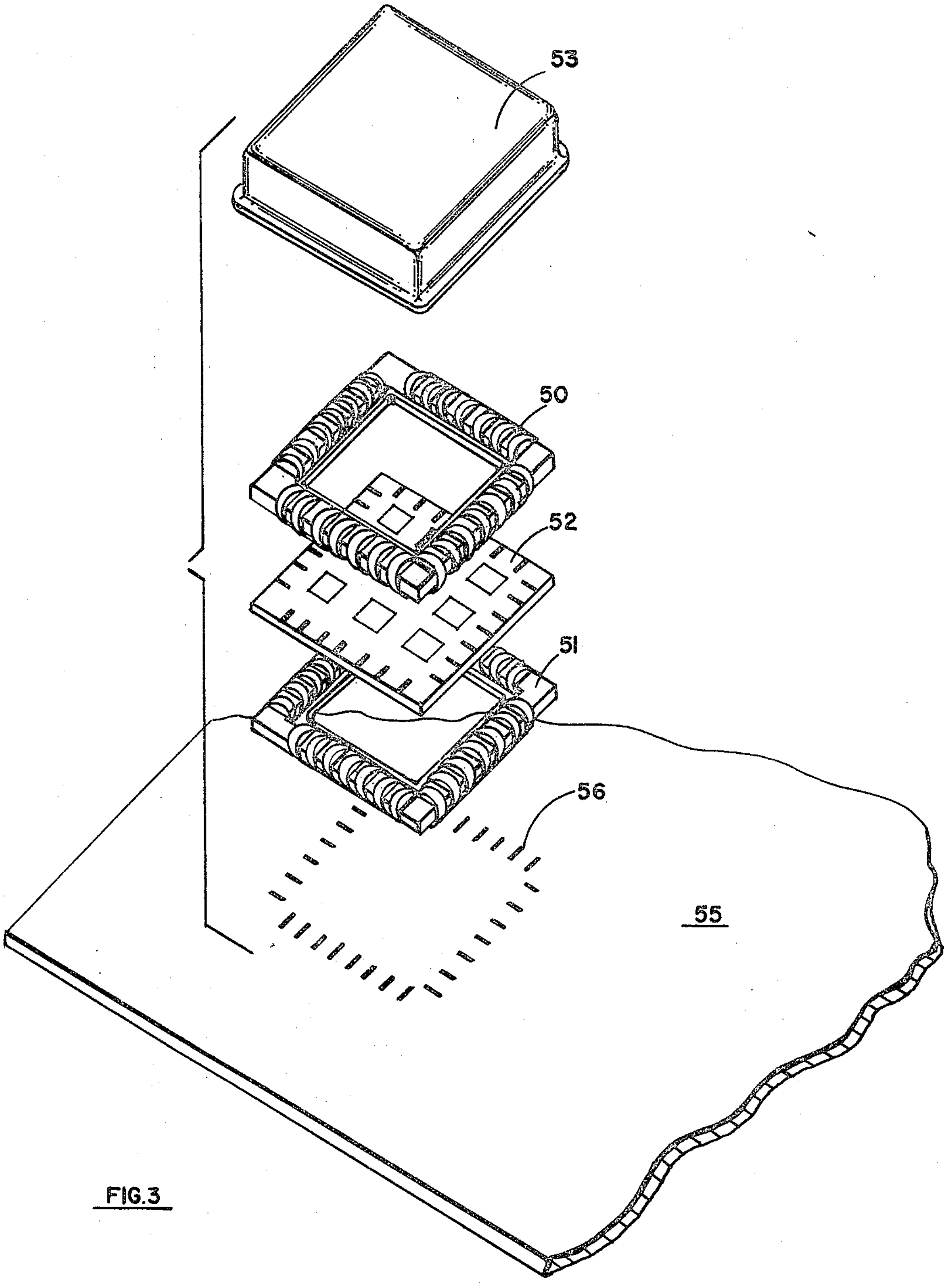
FIG. 3 illustrates an embodiment of the invention in which one electronic system is electronically connected to another system.

FIG. 3 shows connector frames 50 and 51 disposed on both sides of module 52. The frames and module fit inside the cover 53 which may be provided with rails corresponding to the contacts 54 about the periphery of the module. It is pointed out that a plurality of modules and frames could be used depending on the requirements of a particular application.

The cover 53 secures the frames and module to the circuit board 55 so that the connectors of frame 51 are in contact with terminals 56 of the circuit board. The circuit board may be part of an electronic assembly to which it is desired to connect the electronic system comprising module 52. The cover may also be provided with connector pins for input-output purposes.

We claim:

1. A package for an assembly of modules forming an electronic system, said modules having contact pads about their peripheries, said package comprising, housing means having a plurality of insulated conducting strips along its inner surfaces, said strips extending past the edges of the modules and having a spacing corresponding to the spacing of the contact pads of said modules, a plurality of members disposed between said modules and in a plane parallel to the plane of said modules, said plurality of members each including a plurality of compressibe electrical contacts connected about the periphery of each member, said electrical contacts having a spacing for mating with the contact pads of said modules and for contacting the conducting strips along the inner surfaces of said housing means corresponding with the contact pads of said modules.

2. The combination recited in claim 1 including a circuit board comprising at least a portion of a second electronic assembly, and wherein said package includes means for connecting said housing means to a portion of said circuit board for electrically connecting said first recited electronic system to said second electronic assembly.

3. The combination recited in claim 1 wherein said plurality of members each have a frame configuration comprising alternating ridges formed about the longitudinal axes of the edges of said frame, said ridges having a spacing for accommodating said electrical contacts, said electrical contacts being secured about the longitudinal axes of said frame in the spacing between said ridges.

4. The combination recited in claim 1 wherein said electrical contacts comprise compressible rings, and said members comprise frames having edges on which said compressible rings have been secured, said rings having an uncompressed radius for permitting said frame means to be easily inserted inside said housing means and a compressed radius which forces the outer edges of the rings into contact with the conducting strips.

References Cited

UNITED STATES PATENTS

| | | | |
|---|---|---|---|
| 3,368,115 | 2/1968 | Hoffman | 317—101 |
| 3,376,479 | 4/1968 | Wines et al. | 317—101 |

ROBERT K. SCHAEFER, Primary Examiner

J. R. SCOTT, Assistant Examiner

U.S. Cl. X.R.

339—17